Dec. 2, 1958 S. J. RUSK 2,863,050

ELECTRONIC SERVO AMPLIFIER

Filed April 16, 1954 2 Sheets-Sheet 1

INVENTOR.
STANLEY JOHN RUSK

BY [signature]

ATTORNEYS

Dec. 2, 1958 S. J. RUSK 2,863,050
ELECTRONIC SERVO AMPLIFIER
Filed April 16, 1954 2 Sheets-Sheet 2

INVENTOR.
STANLEY JOHN RUSK
BY
ATTORNEYS

United States Patent Office 2,863,050

Patented Dec. 2, 1958

2,863,050

ELECTRONIC SERVO AMPLIFIER

Stanley John Rusk, Hatboro, Pa.

Application April 16, 1954, Serial No. 423,862

2 Claims. (Cl. 250—27)

Figure 1:
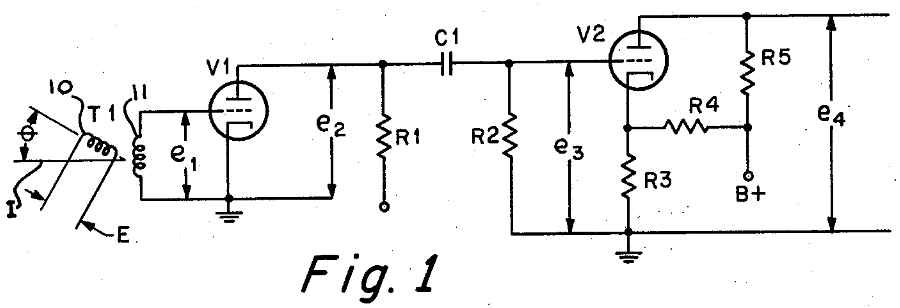

(Granted under Title 35, U. S. Code (1952), sec. 266)

The invention described herein may be manufactured and used by or for the Government of the United States of America for governmental purposes without the payment of any royalties thereon or therefor.

The invention of this application relates to an electronic servo amplifier and more particularly relates to an electronic amplifier intended for use with servo mechanisms and wherein signal amplification and a modified derivative control is provided which will be effective in suppressing oscillations of sensitive servo systems.

Previous devices used for this purpose include alternating current and direct current amplifier networks, amplifiers together with tachometer feedback, and amplifiers together with viscous fluid shear. Alternating current networks have the disadvantage of being useful only in systems of natural frequency high enough to insure side bands that are substantially wider than the carrier drift. Direct current neworks are accompanied by the usual disadvantages of direct current amplification, including voltage drift and high potential differences. Tachometers and fluid shear devices require mechanical attachment and are relatively costly and bulky.

The inventive apparatus overcomes these disadvantages and provides a form of error anticipation with negligible increase in dynamic gain proportional to system frequency; this quality will stabilize a system in which direct derivative anticipation is ineffective. The present invention further provides an alternating current system whose usefulness extends to zero natural frequency of servo mechanism oscillations. In the inventive device the derivative feature is accomplished without addition of components to those already required for voltage amplification alone. The apparatus of this application has a further advantage in that it can be used to replace or augment any of the common servo system stabilization techniques.

Accordingly, one purpose of the invention is to provide apparatus for signal amplification and modified derivative control which is effective in suppressing oscillations of sensitive servo systems.

Another purpose is to provide an electronic servo amplifier which is less costly and bulky than other apparatus now provided for this function, which will not have appreciable voltage drift and high potential differences and wherein a wide range of applicability to systems regardless of the natural frequency of these systems is possible.

Another aim of the invention is to provide an apparatus to introduce a form of error anticipation with negligible increase in dynamic gain proportional to system frequency, thereby causing stabilization of systems where direct derivative anticipation is ineffective.

Another object of the invention is to provide an alternating current system whose usefulness extends to zero natural frequency of servo mechanism oscillations.

Still another aim of the invention is to provide an electronic amplifier with a derivative feature which is accomplished without the addition of components to those already required for voltage amplification alone.

Still another aim of the invention is to provide apparatus which can be used to replace or augment any of the common servo system stabilization techniques in effect, and wherein superior performance, greater range of operation, economy of operation, low initial cost and greater adaptability is present.

Figure 2A:
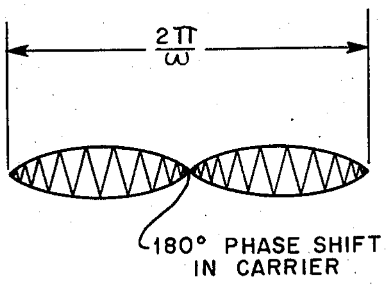
Figure 2B:
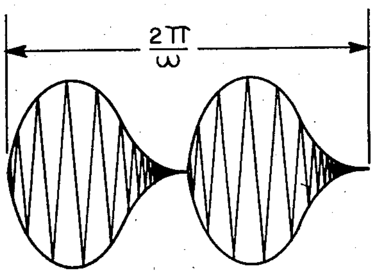
Figure 3A:
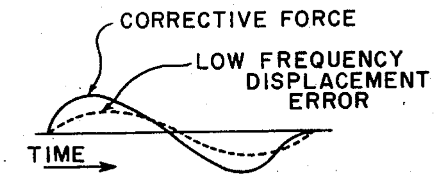
Figure 3B:
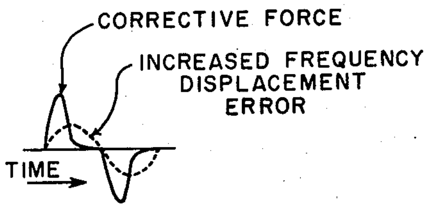
Figure 4:
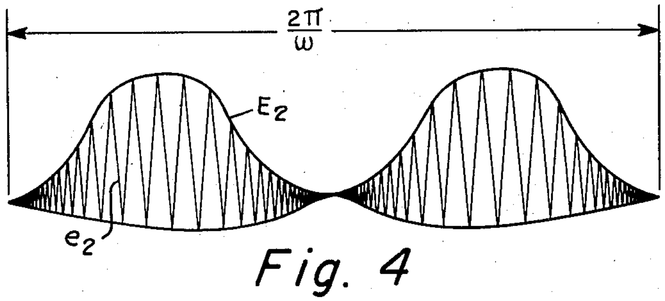
Figure 5:
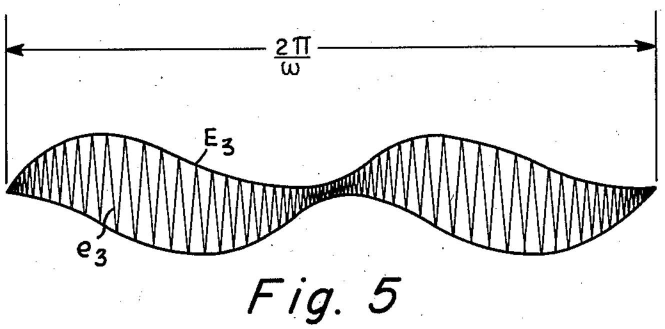
Figure 6:
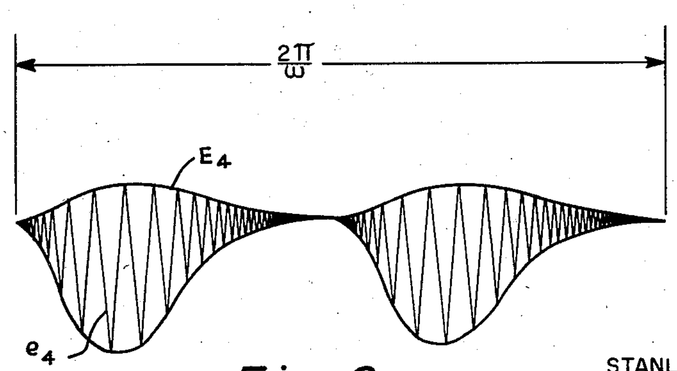

Other objects and many of the attendant advantages of this invention will be readily appreciated as the same becomes better understood by reference to the following detailed description when considered in connection with the accompanying drawings wherein:

Fig. 1 is a schematic diagram of an illustrative embodiment of the electronic servo amplifier of the invention, Fig. 2*a* is a graphical representation of the form of error input signal to the apparatus of the subject invention, Fig. 2*b* is a graphical representation of the amplified output of the apparatus showing the amount of distortion increasing in proportion to the frequency of the input envelope, Fig. 3*a* is a graphical representation of corrective force and of low frequency displacement error as plotted against time, Fig. 3*b* is a graphical representation of corrective force and of increased frequency displacement error as plotted against time, Fig. 4 is a graphical representation of the wave form developed at the output of the first stage of the illustrative embodiment of the inventive apparatus and designated as $E_2$ in Fig. 1, Fig. 5 is a graphical representation of the wave form at the input to the second stage of the apparatus shown by way of illustrative embodiment and designated as $E_3$ in Fig. 1, and, Fig. 6 is a graphical representation of the wave form output of the illustrative embodiment of the apparatus taken at $E_4$ of Fig. 1 showing the desired wave form similar to characteristics of the form of Fig. 2*b* and containing an additional direct current component which can be used to increase the prescribed effect through use of more amplifier stages.

Figure 1 shows a transformer T1 which may be a synchro with rotor excitation E and instantaneous rotor angle $\theta$ with axis I. The angle $\theta$ represents the displacement error while $\theta_1$ is the maximum error or swing of primary 10. Across the stator will be developed an envelope voltage $E_1$, an instantaneous carrier voltage $e_1$ where $$E=E_2 \sin \omega_c t \quad \theta=\theta_1 \sin \omega t \omega_c>>\omega$$

where $f_c$=the carrier frequency, i. e. 400 cycles $\omega_c=2\pi f_c$ $f$=modulation frequency accomplished by moving the rotor with respect to the stator, and $\omega=2\pi f$ For small values of $\theta$:

$$e_1=E\theta=E_1\theta_1 \sin \omega t \sin \omega_{ct}$$

Figure 2*a* shows the carrier wave and its envelope produced at $E_1$ as a result of the movement of the transformer primary 10 reflecting the fluctuating displacement error signal. The frequency of the envelope enclosing the carrier wave is determined by the frequency of the movement of primary 10. It is a purpose of the instant invention to produce a correction signal which provides a form of error anticipation. For example, Figure 2*b* shows a typical corrective signal which is desired to be produced as a consequence of the error signal shown in Figure 2*a*. It will be noted from Figure 2*b* that the envelope voltage rises quickly at the beginning of the cycle representing the rising error signal in the beginning of the cycle shown in Figure 2*a*. In the latter half of the first half cycle, shown in Figure 2*b*, the envelope voltage drops off quickly which reflects the decreasing error signal during the latter part of the first half of the cycle shown in Figure 2*a*. In order to produce such a correction signal, which is a distortion of the displacement error signal, the circuit of Figure 1 has been devised. In order to produce this distortion, a triode $V_1$ is supplied operating at no grid bias whereas such bias would ordinarily be required to produce an undistorted sine wave output. A desirable but not necessary additional feature of the first tube is increased gain with the amplitude of $E_1$; then the average value of $E_2$ at the output of V1 will be a reasonably smooth sinusoid, and $E_2$ will have the appearance of the representation of Fig. 4.

In further explanation of the operation of tube $V_1$, it is noted that because the input grid is biased at or approximately zero, there results a lower gain for the positive portion of the cycle than for the negative portion of the cycle. Therefore, at the anode of tube $V_1$ by such distortion and the usual inversion the wave form of Figure 4 is obtained.

As heretofore explained, the wave form at $E_2$ will have the appearance of the wave form of Fig. 4. The instantaneous voltage $e_2$ shown in Fig. 4 is of the form:

$$e_2=E_2 \sin \omega T \sin \omega_c t+E_3 \sin 2\omega t$$

If the time constant of capacitor C1 and resistor R2 is less than $1/\omega$, that is if $$RC\ll\frac{1}{\omega}$$

the voltage at the input of tube V2, $E_3$ is essentially:

$$e_3=E_2 \sin \omega t \sin \omega_c t+E_4 \cos 2\omega t$$

and $E_4$, the output waveform, increases with signal envelope frequency. For best results of shift as desired RC must be less than $1/\omega$. However some shift will occur without this limitation of values of resistance and capacitance. The input wave form of tube V2, $E_3$, is illustrated in Fig. 5.

With suitable negative bias on the grid of tube V2, the positive values of $e_3$ will be amplified more than the negative ones. As in the case of tube V1 performance here is enhanced by the characteristic of increased gain with increased input amplitude. The output $E_4$, shown at the output of stage V2 in the schematic representation of Fig. 1, will then have the appearance of the wave form shown in Fig. 6, wherein the energy transmitted at the carrier frequency is crowded to the left in each half cycle of $\theta$ in proportion to the frequency of $\theta$.

In that manner the desired wave form of Fig. 2*b* to provide corrective force to oppose the servo displacement error as shown in Fig. 2*a* is provided, although the desired wave form of Fig. 6, contains an additional direct current (D. C.) component (which can be used to increase the prescribed effect through use of more amplifier stages).

The RC network consisting of capacitor $C_1$ and resistor $R_2$, referred to above, is so chosen as to allow for a phase shift in the distorted envelope frequency approaching 90 degrees.

This shifting of the low frequency component by the differentiating network produces a bias which varies during each half cycle to produce a crowding to the left in each half cycle of the energy transmitted at the carrier frequency. Output stage V2 is a tube chosen so that the output stage is biased at a larger negative value than the normal bias voltage for the particular tube when used as a high fidelity amplifier. Biasing occurs by current flow through resistor R3, the current continuing its path through the tube V2 and anode load R5 and also through R4 then through the high voltage supply and thence to ground. Resistor R1 provides anode or plate load for tube V1 and resistor R5 provides plate or anode load for tube V2. Because of the biasing of output stage V2 through a larger negative value than the normal bias voltage for the particular tube, the positive values of the input voltage to tube V2 will be amplified more than the negative ones. Hence the output of this stage will both invert and distort the input, so that the input wave form of Fig. 4 will be converted through this stage to the output wave forms shown in Fig. 6 with its D. C. or low frequency component.

In that manner the apparatus produces the wave form of the type shown in Fig. 2*b*, in that the particular type of amplification required is caused by tube biasing and the second half of the cycle is attenuated because of the bias that results from the differentiation due to the resistance-capacitance network of correct RC time constant at the input of the second stage.

In summing up the operation of this invention, triode V1 amplifies and distorts the input error signal to produce an error signal which has a varying D. C. component which may be differentiated by the RC circuit consisting of capacitor C1 and resistor R2. The distorted signal produced by triode V1 is shown in Fig. 4, showing the net D. C. component. After differentiation and phase shift by the RC circuit, a wave such as shown in Figure 5 is produced. This wave form becomes the input to triode V2, which, because of its grid bias characteristics, is able to amplify and distort the signal of Figure 5 to produce a wave form shown in Figure 6 which is the equivalent to the wave form in Figure 2*b*, which is the desired corrective signal as explained above.

Thus, there is provided an apparatus for introducing a form of error anticipation with negligible increase in dynamic gain proportional to system frequency, thereby stabilizing systems where direct derivative anticipation is ineffective, and wherein the range of operation is at a maximum in that the usefulness extends to zero natural frequency of servo mechanism oscillations, and wherein economy is gained in that the derivative feature is accomplished without the addition of components to those already required for voltage amplification alone, the apparatus and method being readily adaptable to replace or augment any of the common servo system stabilization techniques and apparatus.

It should be understood, of course, that the foregoing disclosure relates to only a preferred embodiment of the invention and that numerous modifications or alterations may be made therein without departing from the spirit and scope of the invention as set forth in the appended claims. For example, one alternative method of obtaining the desired output wave form output is by use of integrated feedback in one or more stages of the amplifier. It must be understood if this modification is to be made that this would involve the addition of components not necessary in the basic voltage amplifier as shown by way of example in Fig. 1. Various types of tubes or uniflow electronic devices could be used and other forms of differentiation than the resistance-capacitance network shown could be used. Other forms of biasing means of V2 could be employed without deviating from the inventive teachings.

Obviously many modifications and variations of the present invention are possible in the light of the above teachings. It is therefore to be understood that within the scope of the appended claims the invention may be practiced otherwise than as specifically described.

What is claimed is:

1. An electronic servo amplifier for use with servo mechanisms providing signal amplification and a modified derivative control effective to suppress oscillations of sensitive servo systems comprising an input synchro transformer having a rotor and a stator, a first vacuum tube having a plate, a control electrode and a cathode, said first vacuum tube being designed for relatively undistorted amplification when at a negative bias, the cathode of said triode being grounded, the stator of said input synchro being disposed between the control electrode of said triode and ground, a B+ voltage supply source, a plate load resistor having one end tied to the plate of said triode and having its other end connected to the B+ voltage supply source, a second triode having a plate, a control electrode and a cathode, a resistor disposed between the cathode of said second triode and ground, a plate load resistor having one end connected to the anode of said second triode and having its other end connected to the B+ positive voltage source, a resistor disposed between the cathode of said second triode and the B+ voltage source, differentiating means disposed between the first triode and the second triode, said differentiating means comprising a capacitor having one end connected to the plate of said first triode and having its other end connected to the control electrode of said second triode and a resistor having one end connected to the control electrode of said second triode and having its other end connected to ground, the values of the resistor and the capacitor being such as to provide approximately 90° phase shift of the signal coupled between the first triode and the second triode, the cathode resistor and the resistor disposed between the cathode and the B+ supply serving to provide bias so as to allow positive values of input voltage to be amplified more than negative ones, the second triode having the characteristic of increased gain with increased input amplitude and means to take output between the plate of said second triode and ground.

2. An electronic amplifier comprising a three element uniflow electronic device having an anode, a control electrode and a cathode, said uni-flow device being of characteristics to transmit substantially undistorted output at a bias point wherein the control electrode is negative with respect to the cathode, input variable transformer coupling means including a rotor and a stator, the cathode being tied directly to ground, the stator of the input transformer being connected between the control electrode of the uniflow device and ground, an anode load, zero biasing of the cathode due to its direct connection to ground causing amplification and rectification wherein the gain of the first stage is lower for positive input voltages than for negative input voltages, a second uni-flow electronic device having an anode, a control electrode and a cathode, means to bias the cathode of the second uni-flow device so that the positive values of input voltage to the second uni-flow device will be amplified more than the negative ones a capacitor disposed between the anode of the first uni-flow device and the control electrode of the second uni-flow device, a resistor disposed between the control electrode of the second uni-flow device and ground, the resistance-capacitance time constant value of said last named capacitor and resistor being such as to provide for a substantially 90° phase shift in voltage between the first uni-flow device and the second uni-flow device to provide crowding to the left in each half cycle of input wave form, an anode load in said second uni-flow device, and means to apply anode voltage to said first uni-flow device and said second uni-flow device.

References Cited in the file of this patent

UNITED STATES PATENTS

| | | |
|---|---|---|
| 2,139,489 | Cockrell | Dec. 6, 1938 |
| 2,156,658 | Shore | May 2, 1939 |
| 2,233,415 | Hull | Mar. 4, 1941 |
| 2,446,567 | White et al. | Aug. 10, 1948 |
| 2,507,145 | Dean | May 9, 1950 |
| 2,576,329 | Bell | Nov. 27, 1951 |
| 2,624,796 | Saunders | Jan. 6, 1953 |